(12) United States Patent
Wang (10) Patent No.: US 12,316,083 B2
(45) Date of Patent: May 27, 2025

(54) CABLE PROTECTION DEVICE

(71) Applicant: Changchun Jetty Automotive Technology Co., Ltd., Jilin (CN)

(72) Inventor: Chao Wang, Jilin (CN)

(73) Assignee: Changchun Jetty Automotive Technology Co., Ltd., Jilin (CN)

( * ) Notice: Subject to any disclaimer, the term of this patent is extended or adjusted under 35 U.S.C. 154(b) by 0 days.

(21) Appl. No.: 18/547,134

(22) PCT Filed: Mar. 10, 2022

(86) PCT No.: PCT/CN2022/080194
§ 371 (c)(1),
(2) Date: Aug. 18, 2023

(87) PCT Pub. No.: WO2022/188843
PCT Pub. Date: Sep. 15, 2022

(65) Prior Publication Data
US 2024/0136805 A1 Apr. 25, 2024
US 2024/0235172 A9 Jul. 11, 2024

(30) Foreign Application Priority Data
Mar. 12, 2021 (CN) .......................... 202110272081.0

(51) Int. Cl.
*H05K 9/00* (2006.01)
*H02G 15/115* (2006.01)

(52) U.S. Cl.
CPC ......... *H02G 15/115* (2013.01); *H05K 9/0098* (2013.01); *H05K 9/0015* (2013.01)

(58) Field of Classification Search
CPC .................................................. H05K 9/0098
See application file for complete search history.

(56) References Cited

U.S. PATENT DOCUMENTS 8,790,137 B2 7/2014 Deno et al.
2012/0058674 A1 3/2012 Deno et al.
(Continued)

FOREIGN PATENT DOCUMENTS

CN 107380094 A 11/2017
CN 110854620 A 2/2020
(Continued)

OTHER PUBLICATIONS

International Searching Authority, "International Search Report," issued in connection with International Patent Application No. PCT/CN2022/080194, mailed May 25, 2022, 3 pages.
(Continued)

*Primary Examiner* — Hung V Ngo
(74) *Attorney, Agent, or Firm* — Hanley, Flight & Zimmerman, LLC (57) ABSTRACT

A cable protection device, including: a first sleeve provided with a first accommodating cavity and configured to allow the cable to pass through the first accommodating cavity; and a second sleeve provided with a second accommodating cavity and configured to allow the cable to pass through the second accommodating cavity. The second sleeve is capable of being moved in a butting direction to butt with the first sleeve. A side wall of the first sleeve is provided with a protruding portion. A side wall of the second sleeve is provided with a clamping groove and a clamping portion which are sequentially distributed along the butting direction. In the case of the second sleeve being butted with the first sleeve, the first accommodating cavity is in communication with the second accommodating cavity, and the protruding portion is clamped with the clamping groove.

14 Claims, 8 Drawing Sheets

(56) References Cited

U.S. PATENT DOCUMENTS

| | | |
|---|---|---|
| 2013/0081847 A1 | 4/2013 | Wu et al. |
| 2013/0081848 A1 | 4/2013 | Wu et al. |
| 2014/0260071 A1 | 9/2014 | Coon |
| 2015/0237771 A1* | 8/2015 | Natter .................. H05K 9/0098 174/77 R |
| 2016/0134096 A1* | 5/2016 | Kett ........................ H01R 4/20 174/360 |
| 2018/0198266 A1* | 7/2018 | Inoue ................... H01R 13/115 |
| 2019/0363522 A1 | 11/2019 | Perez-Lazcano et al. |
| 2020/0412120 A1 | 12/2020 | Volpone et al. |

FOREIGN PATENT DOCUMENTS

| | | |
|---|---|---|
| CN | 210576783 U | 5/2020 |
| CN | 211239181 U | 8/2020 |
| CN | 211579071 U | 9/2020 |
| CN | 212114637 U | 12/2020 |
| CN | 212162114 U | 12/2020 |
| CN | 212230220 U | 12/2020 |
| CN | 113036686 A | 6/2021 |
| JP | 3151387 | 6/2009 |
| JP | 2010213426 A | 9/2010 |
| KR | 1020200129246 | 11/2020 |

OTHER PUBLICATIONS

International Searching Authority, "Written Opinion," issued in connection with International Patent Application No. PCT/CN2022/080194, mailed on May 25, 2022, 9 pages. [English translation included].

International Bureau, "International Preliminary Report on Patentability," issued in connection with International Patent Application No. PCT/CN2022/080194, mailed on Sep. 12, 2023, 11 pages. [English translation included].

Japanese Patent Office, "First Office Action," issued in connection with Japanese Patent Application No. 2023-552344, dated Aug. 13, 2024, 12 pages. [English translation included].

European Patent Office, "Extended European Search Report," issued in connection with European Patent Application No. 22766365.5, dated Dec. 20, 2024, 9 pages.

* cited by examiner

CABLE PROTECTION DEVICE

RELATED APPLICATION

The present application is a U.S. National Stage of International Application No. PCT/CN2022/080194, filed Mar. 10, 2022, which claims priority to Chinese Patent Application No. 202110272081.0, filed on Mar. 12, 2021, and entitled "Cable Protection Device".

TECHNICAL FIELD

The present disclosure relates to the technical field of electrical assembly, in particular to a cable protection device.

BACKGROUND

Cable sheaths are commonly used in electrical assembly to secure and protect cables. For example, when a plurality of cables are butt-connected, the cable connection is placed within the cable sheath, which can prevent personnel and other equipment from directly contacting the cable connection and reduce the risk of electric shock. When the cable needs to be arranged on a vehicle, the cable sheath can be installed on the vehicle body, and the cable passes through the cable sheath, which can play a role of limiting and protecting the cable. The cable sheath used in the electrical assembly of new energy vehicles mainly plays the protective role of fixing and protecting the wire harness, and has the function of flame retardant, waterproof and preventing the wire harness from being damaged by external forces.

The cable sheaths are generally of an assembled structure for ease of assembly, and disassembly of the cable sheath should be carried out in accordance with the safety regulations. However, in the process of patrol inspection or maintenance, the working personnel sometimes disassemble the cable sheath in violation of regulations for the convenience of maintenance and due to lax safety consciousness, and the cable sheath is disassembled by mistake. Without the protective of the cable sheath, the wire is easily touched by the working personnel and lead to electric shock hazard, thus there is a great potential safety hazard.

SUMMARY

An object of the present disclosure is to provide a cable protection device, so as to solve the technical problem that the worker may easily disassemble the sheath by misoperation and touch the cable inside the sheath, resulting in a great risk of electric shock.

The above object of the present disclosure can be achieved by adopting the following technical solutions.

The present disclosure provides a cable protection device, including a first sleeve and a second sleeve. The first sleeve is provided with a first accommodating cavity for accommodating a cable, and is configured to allow the cable to pass through the first accommodating cavity. The second sleeve is provided with a second accommodating cavity for accommodating a cable, and is configured to allow the cable to passes through the second accommodating cavity. The second sleeve is capable of being moved in a butting direction to butt with the first sleeve. A side wall of the first sleeve is provided with a protruding portion, and a side wall of the second sleeve is provided with a clamping groove and a clamping portion which are sequentially distributed in the butting direction. In the case of the second sleeve being butted with the first sleeve, the first accommodating cavity is at least partially in communication with the second accommodating cavity, the protruding portion is clamped with the clamping groove, the clamping portion is configured to prevent the protruding portion from disengaging from the clamping groove, and the clamping portion is restricted from moving in a direction away from the side wall of the first sleeve.

The present disclosure has the following features and advantages:

In the cable protection device, the protruding portion is clamp-engaged with the clamping groove and the clamping portion, so it is possible to prevent the first sleeve from being disengaged from the second sleeve. In the case of the second sleeve being butted with the first sleeve, the clamping portion is restricted from moving in a direction away from the side wall of the first sleeve, so that the clamping portion is kept in a constant position and is not easily deformed or moved, which then increases the difficulty of driving the clamping portion to deform or move to disengage the clamping portion from the clamping groove, making the connection between the first sleeve and the second sleeve more stable, and making it difficult for the worker to dismantle the cable protection device, so that the cable protection device is not easy to be disassembled due to misoperation and can perform a better protection effect As a result, it is possible to reduce the risk of electric shock caused by the worker touching the cable in the cable protection device due to misoperation of disassembling the cable protection device.

BRIEF DESCRIPTION OF DRAWINGS

The following drawings are intended only to schematically illustrate and explain the present disclosure and do not limit the scope of the present disclosure. In the drawings.

DESCRIPTION OF EMBODIMENTS

For a clearer understanding of the technical features, objectives and effects of the present disclosure, specific embodiments of the present disclosure will now be described with reference to the accompanying drawings. In description of the present disclosure, "a plurality of" means two or more, unless otherwise indicated.

The cable protection device includes at least one sleeve 10 provided with an accommodating cavity 101 for accommodating a cable and through which the cable can pass.

In some cases, the cable protection device includes a sleeve 10, which can be mounted on the vehicle body and allow the cable to pass through it to limit and protect the cable.

In some other cases, the cable protection device includes a plurality of sleeves 10. Specifically, the plurality of sleeves 10 include a first sleeve 50 and a second sleeve 60. The first sleeve 50 is provided with a first accommodating cavity 51 for accommodating a cable and is configured to allow the cable to pass through the first accommodating cavity 51. The second sleeve 60 is provided with a second accommodating cavity 61 for accommodating a cable, and is configured to allow the cable to pass through the second accommodating cavity 61. The second sleeve 60 is capable of being moved in a butting direction 100 to butt with the first sleeve 50. In the case of the second sleeve 60 being butted with the first sleeve 50, the first accommodating cavity 51 is in communication with the second accommodating cavity 61, and the cable can pass through the first sleeve 50 and the second sleeve 60. A connection part of the cable may be placed in the first accommodating cavity 51 and the second accommodating cavity 61 to be protected.

The First Embodiment

Figure 4A:
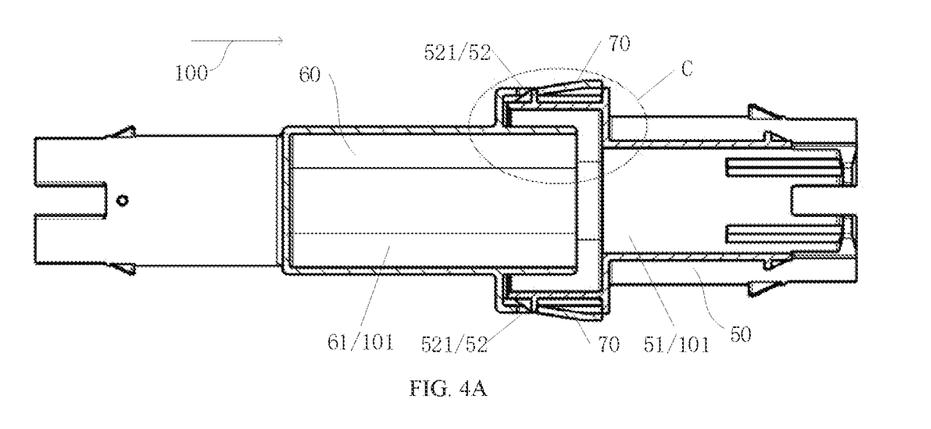
FIG. 4A is a vertical sectional view of the cable protection device shown in FIG. 1.
Figure 5A:
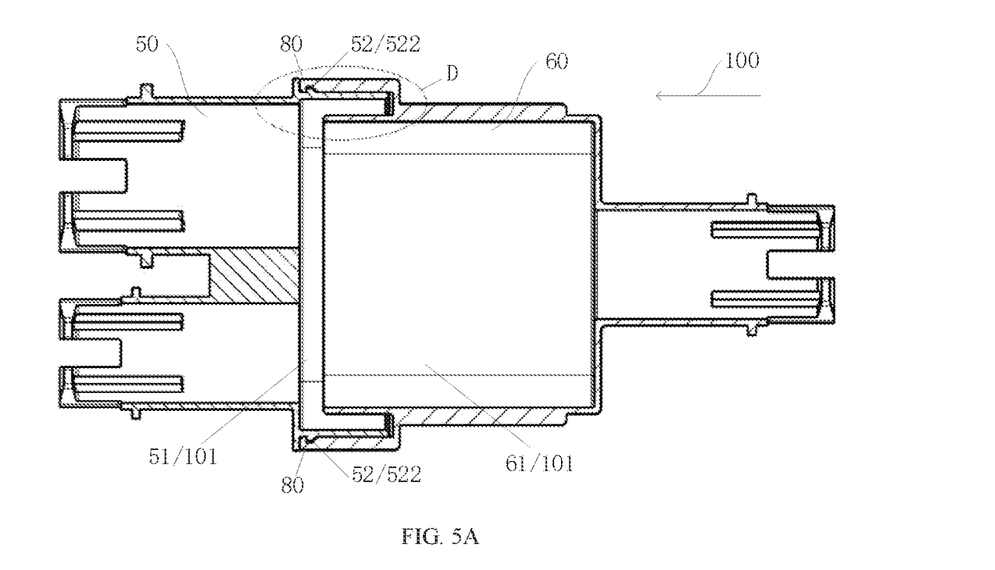
FIG. 5A is a horizontal sectional view of the cable protection device shown in FIG. 1.
Figure 5B:
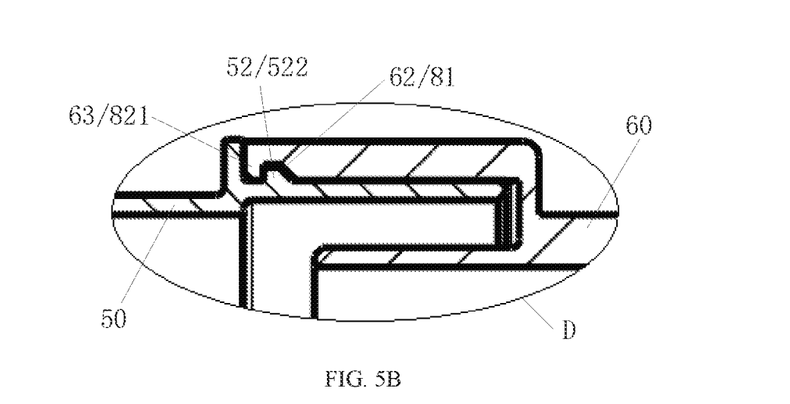
FIG. 5B is an enlarged fragmentary view of position D in FIG. 5A.
Figure 6:
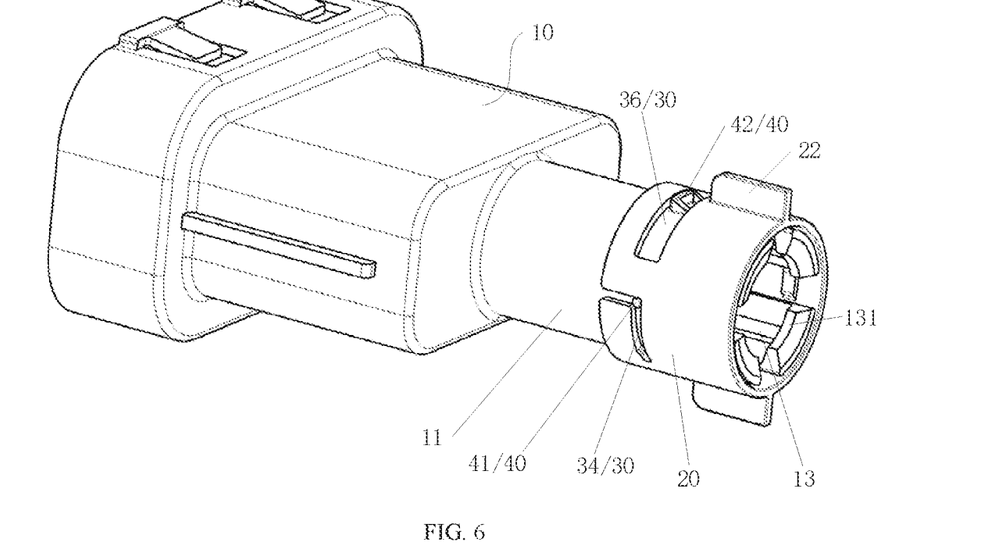
FIG. 6 is a structural schematic diagram of a cable protection device provided by the present disclosure.

The present disclosure provides a cable protection device, as shown in FIGS. 1 to 3B, the cable protection device includes a first sleeve 50 and a second sleeve 60. The first sleeve 50 is provided with a first accommodating cavity 51 for accommodating a cable and is configured to allow the cable to pass through the first accommodating cavity 51. The second sleeve 60 is provided with a second accommodating cavity 61 for accommodating a cable, and is configured to allow the cable to pass through the second accommodating cavity 61. The second sleeve 60 is capable of being moved in a butting direction 100 to butt with the first sleeve 50. A side wall of the first sleeve 50 is provided with a protruding portion 52. A side wall of the second sleeve 60 is provided with a clamping groove 62 and a clamping portion 63 which are sequentially distributed in the butting direction 100. In the case of the second sleeve 60 being butted with the first sleeve 50, as shown in FIGS. 4A and 5A, the first accommodating cavity 51 is at least partially in communication with the second accommodating cavity 61, the protruding portion 52 is clamped with the clamping groove 62, the clamping portion 63 is configured to prevent the protruding portion 52 from disengaging from the clamping groove 62, and the clamping portion 63 is restricted from moving in a direction away from the side wall of the first sleeve 50.

In the cable protection device, the protruding portion 52 is clamp-engaged with the clamping groove 62 and the clamping portion 63, so it is possible to prevent the first sleeve 50 from being disengaged from the second sleeve 60. In the case of the second sleeve 60 being butted with the first sleeve 50, the clamping portion 63 is restricted from moving in a direction away from the side wall of the first sleeve 50, so that the clamping portion 63 is kept in a constant position and is not easily deformed or moved, which then increases the difficulty of driving the clamping portion 63 to deform or move to disengage the clamping portion 63 from the clamping groove 62, making the connection between the first sleeve 50 and the second sleeve 60 more stable, and making it difficult for the worker to dismantle the cable protection device, so that the cable protection device is not easy to be disassembled due to misoperation and can perform a better protection effect As a result, it is possible to reduce the risk of electric shock caused by the worker touching the cable in the cable protection device due to misoperation of disassembling the cable protection device.

As shown in FIGS. 1 to 3B, the second sleeve 60 is configured to sleeve outside the first sleeve 50 in the butting direction 100, and the protruding portion 52 is disposed on an outer wall of the first sleeve 50. An end portion of the first sleeve 50 is inserted into the second sleeve 60, and the protruding portion 52 is clamped in the clamping groove 62 on the side wall of the second sleeve 60. Compared to being disposed on the inner wall of the first sleeve 50, the protruding portion 52 being disposed on the outer wall of the first sleeve 50 makes the cable protection device easier to mold and manufacture.

The inventor has further improved the structure of the clamping groove 62.

First Clamping Structure 70

As shown in FIGS. 3A, 3B, 4A and 4B, a side wall of the second sleeve 60 is provided with a first clamping structure 70 including a clamping groove 62 and a clamping portion 63. The clamping groove 62 is a clamping through groove 71, and the clamping portion 63 is a clamping plate 73. The protruding portion 52 abuts against an end face of the clamping plate 73 that is close to the clamping groove 62, so that the clamping plate 73 can prevent the clamping portion 52 from moving in the butting direction 100 and limit the protruding portion 52 in the clamping groove 62. The clamping through groove 71 may have various shapes, for example, a triangular shape, a trapezoidal shape, an elliptical shape, or the like.

Figure 4B:
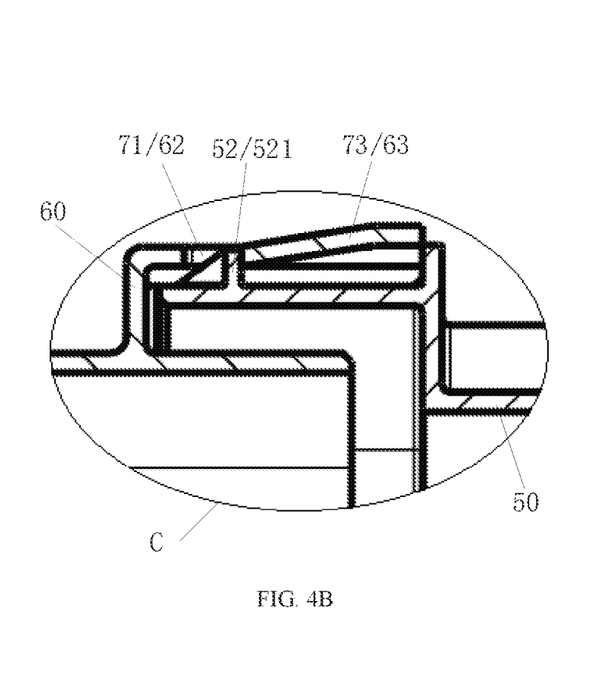
FIG. 4B is an enlarged fragmentary view of position C in FIG. 4A.

Further, the clamping plate 73 is inclined outwardly in the butting direction 100. As shown in FIGS. 4A and 4B, on the one hand, the clamping plate 73 is inclined inward in the direction toward the protruding portion 52, so that a large driving force is required to drive the protruding portion to deform outward; on the other hand, in the direction toward the protruding portion 52, the clamping plate 73 is inclined inward and abuts against the protruding portion 52, so that there is less space for exerting external force to the clamping plate 73, and it is difficult for the operator to apply outward facing force to the clamping plate 73. Therefore, when the second sleeve 60 is butted with the first sleeve 50, the outward movement of the clamping plate 73 is restricted. In this embodiment, the side wall where the first sleeve 50 is located is located inside the clamping plate 73, so that the clamping plate 73 is restricted from moving in a direction away from the side wall of the first sleeve 50.

The clamping plate 73 limits the protruding portion 52 in the clamping groove 62. In order to disengage the protruding portion 52 from the clamping groove 62, it is normally necessary to move the clamping plate 73 outward to move the protruding portion 52 to the inner side of the clamping plate 73. However, as described above, the outward movement of the clamping plate 73 is restricted, so it is difficult for the operator to apply force to move the clamping plate 73 outward, which makes the position of the clamping plate 73 more stable, and makes it more difficult for the protruding portion 52 to disengage from the clamping groove 62, so that the connection between the first sleeve 50 and the second sleeve 60 is more stable, and it is difficult for a worker to detach the cable protection device.

Figure 3A:
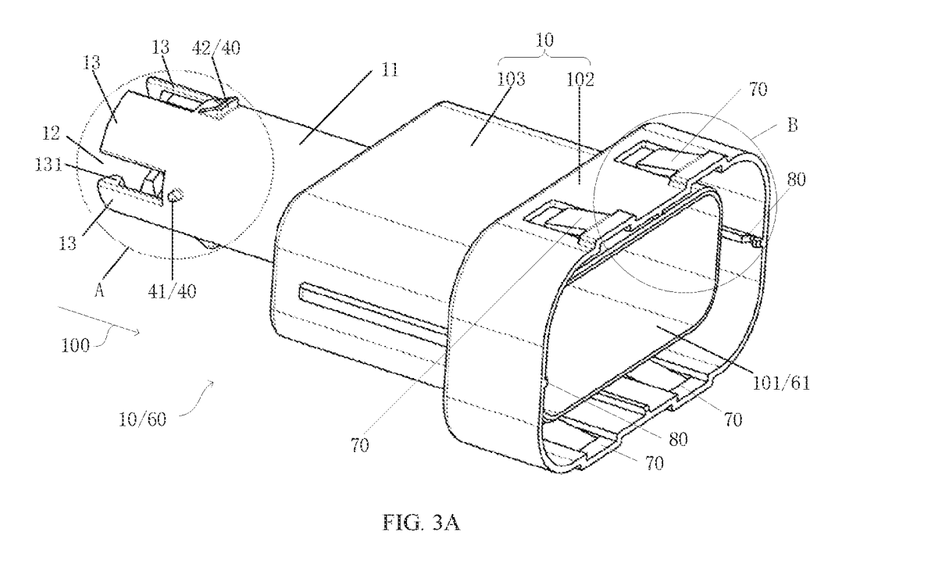
FIG. 3A is a structural schematic diagram of a second sleeve of the cable protection device shown in FIG. 1.
Figure 3B:
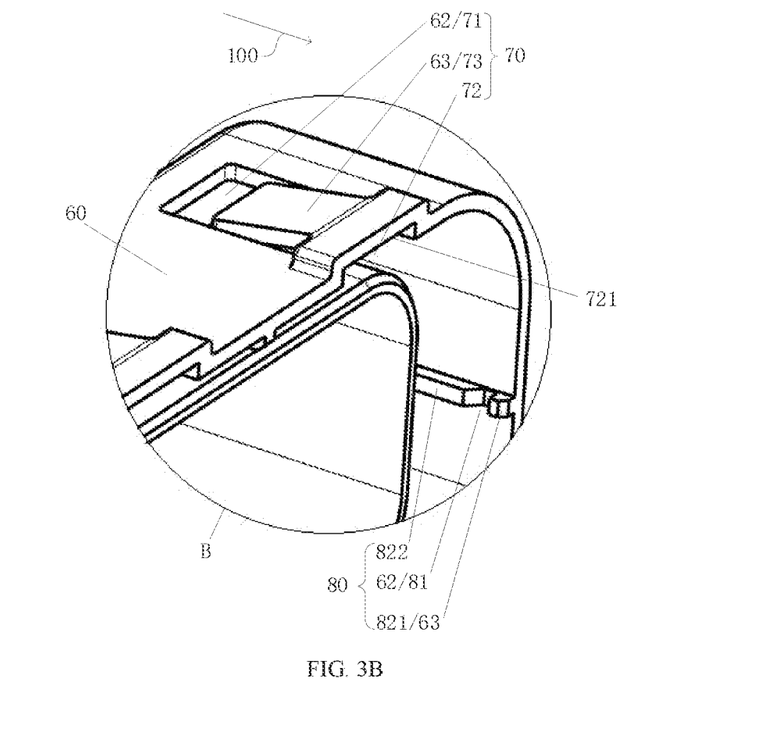
FIG. 3B is an enlarged fragmentary view of position B in FIG. 3A.

As shown in FIGS. 3A and 3B, the first clamping structure 70 includes a guiding groove 72. The clamping plate 73 and the guiding groove 72 are connected to one another in sequence in the butting direction 100. The clamping plate 73 is connected to a groove bottom surface 721 of the guiding groove 72. When the first sleeve 50 and the second sleeve 60 are assembled, the first sleeve 50 is moved toward the second sleeve 60 in the direction opposite to the butting direction 100, during which the protruding portion 52 on the first sleeve 50 first enters the guiding groove 72, then abuts against the inner wall of the clamping plate 73, and then moves into the clamping groove 62 along the butting direction 100. By providing the guiding groove 72, it is easy for the protruding portion 52 to move into the clamping groove 62, and facilitate assembly.

As shown in FIGS. 3A and 3B, the side wall of the second sleeve 60 is provided with a plurality of first clamping structures 70. The first sleeve 50 is provided with a plurality of protruding portions 52 for fitting with the first clamping structures 70, so that the first sleeve 50 is clamped with the second sleeve 60 at a plurality of positions, thereby improving the connection reliability. Further, the clamping groove 62 of at least one first clamping structure 70 is disposed opposite to the clamping groove 62 of another first clamping structure 70. For the two clamping grooves 62 disposed opposite to each other, in order to disengage the protruding portions 52 from the clamping grooves 62, it is necessary to apply forces in opposite directions to the clamping plates 73 corresponding to the two clamping grooves 62, which further increases the difficulty of operation, and reduces the risk of misoperation. For example, as shown in FIGS. 3A and 3B, an end face of the second sleeve 60 is of rectangular shape, and two opposite sides of the rectangle are respectively provided with the first clamping structure 70.

Figure 2A:
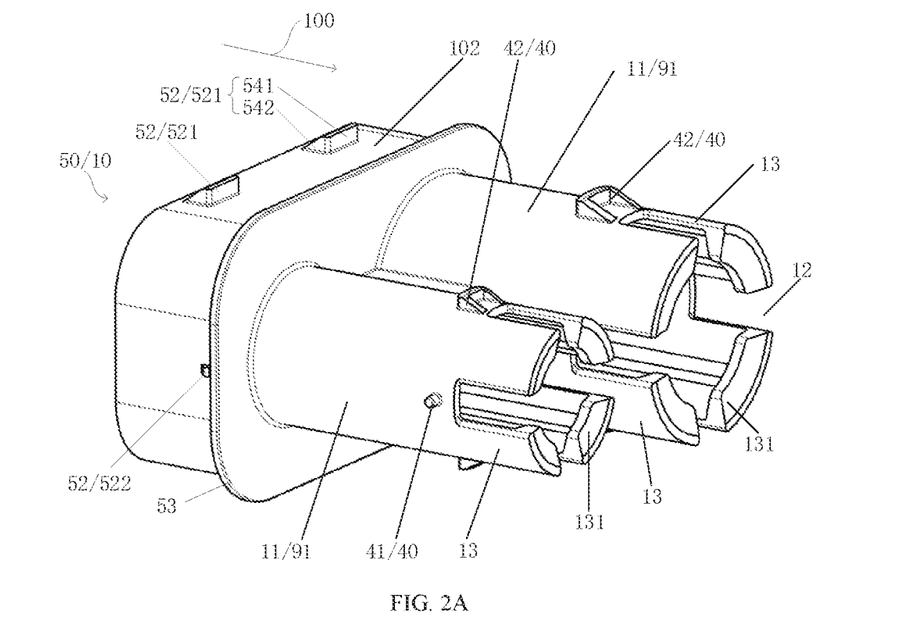
FIG. 2A is a structural schematic diagram of a first sleeve of the cable protection device shown in FIG. 1.

As shown in FIGS. 2A, 4A and 4B, the protruding portion 52 is a clamping convex column 521, and the clamping convex column 521 includes a convex column upright plate 541 capable of moving into the clamping groove 62 along the clamping plate 73 and abutting against an end face of the clamping plate 73 that is close to the clamping groove 62, such that the convex column upright plate 541 is clamped with the clamping groove 62. In an embodiment, the clamping convex column 521 includes a convex column rib plate 542 connected between an outer wall of the first sleeve 50 and the convex column upright plate 541, so the convex column rib plate 542 increases the strength of the clamping convex column 521, thereby the clamping convex column 521 is not easily deformed, which increases the difficulty for the operator to push the clamping convex column 521 to move inward, and is favorable for the clamping convex column 521 to be connected with the clamping groove 62 more stably. Specifically, the convex column rib plate 542 may be disposed to extend along the butting direction 100. As shown in FIG. 2A, the convex column upright plate 541 and the convex column rib plate 542 are configured as the clamping convex column 521. An end face of the clamping plate 73 that is close to the clamping groove 62 serves as a lap joint surface, and an end face of the convex column upright plate 541 of the clamping convex column 521 serves as a lap joint surface, and the two lap joint surfaces are abutted against each other to achieve clamping.

Second Clamping Structure 80

As shown in FIGS. 3A, 3B, 5A and 5B, a side wall of the second sleeve 60 is provided with a second clamping structure 80 including a clamping groove 62 and a clamping portion 63, and the clamping groove 62 is a clamping concave groove 81. Both the clamping groove 62 and the clamping portion 63 are disposed on a side wall of the second sleeve 60, a main body of the side wall of the second sleeve 60 that is located at one side of the clamping groove 62 near the end face of the second sleeve 60 forms a clamping portion 63.

Figure 2B:
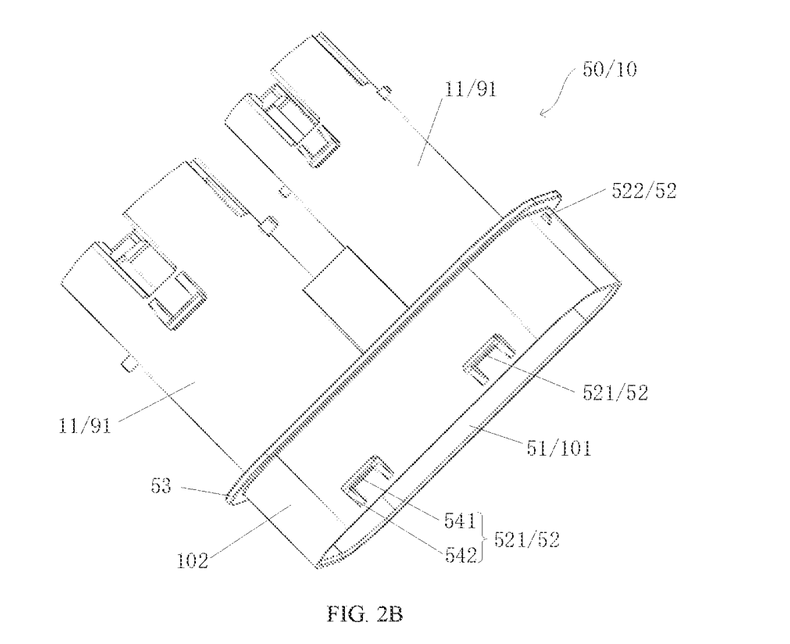
FIG. 2B is a schematic diagram of the first sleeve shown in FIG. 2A, viewed from another perspective.

The protruding portion 52 is disposed on an outer wall of the first sleeve 50, and the second sleeve 60 sleeves outside the first sleeve 50. As shown in FIGS. 2A and 2B, the protruding portion 52 is a positioning clamping column 522. The protruding portion 52 is clamped in the clamping concave groove 81 that is different from the through groove, and the bottom wall of the clamping concave groove 81 covers the protruding portion 52. On one hand, after the first sleeve 50 is butted with the second sleeve 60, the protruding portion 52 and the clamping groove 62 are not visible to the outside, so it is difficult for an operator to identify the position of the protruding portion 52 or the clamping groove 62, thereby making it difficult to operate; on the other hand, the clamping groove 62 is a clamping concave groove 81, the outer wall of the second sleeve 60 is closed, and there is no space for operating the clamping portion 63, so that it is difficult for an operator to apply an external force to the clamping portion 63. Therefore, when the second sleeve 60 is butted with the first sleeve 50, the outward movement of the clamping portion 63 is restricted. In this embodiment, the side wall where the first sleeve 50 is located is located inside the clamping portion 63, thus the clamping portion 63 is restricted from moving in a direction away from the side wall of the first sleeve 50.

In an embodiment, as shown in FIGS. 3A and 3B, the clamping portion 63 is a first clamping bump 821, and the second clamping structure 80 includes a second clamping bump 822. The first clamping bump 821 and the second clamping bump 822 are distributed sequentially at intervals in the butting direction 100, and the clamping groove 62 is disposed between the first clamping bump 821 and the second clamping bump 822. When the first sleeve 50 is to be butted with the second sleeve 60, the protruding portion 52 moves in a direction opposite to the butting direction 100, and enters the clamping groove 62 through the first clamping bump 821. The connecting strength between the protruding portion 52 and the second sleeve 60 is increased by providing the first clamping bump 821 and the second clamping bump 822. Further, the first clamping bump 821 is provided with a bump inclined surface on an outer side thereof, so that the protruding portion 52 can move along the bump inclined surface in the direction opposite to the butting direction 100.

As shown in FIG. 3A, the side wall of the second sleeve 60 is provided with a plurality of second clamping structures 80. The first sleeve 50 is provided with a plurality of protruding portions 52 for fitting with the second clamping structures 80, so that the first sleeve 50 is clamped with the second sleeve 60 at a plurality of positions, thereby improving the connection reliability. For example, as shown in FIG. 3A, an end face of the second sleeve 60 is of rectangular shape, and two opposite sides of the rectangle are respectively provided with the second clamping structure 80.

It has been described above that by means of the first clamping structure 70 and/or the second clamping structure 80, the clamping portion 63 is restricted from moving in a direction away from the side wall of the first sleeve 50, so as to increase the difficulty for an worker to disassemble the cable protection device and reduce misoperation. Another embodiment will be described next.

The first sleeve 50 is configured to sleeve outside the second sleeve 60 in a direction opposite to the butting direction 100, the protruding portion 52 is disposed on the inner wall of the first sleeve 50, and the clamping groove 62 and the clamping portion 63 are both disposed on the side wall of the second sleeve 60. The clamping groove 62 may be a through groove or a concave groove. In the case of the second sleeve 60 being butted with the first sleeve 50, the side wall of the first sleeve 50 surrounds the side wall of the second sleeve 60, and the protruding portion 52, the clamping portion 63, and the clamping groove 62 are all located inside the side wall of the second sleeve 60, such that the protruding portion 52, the clamping portion 63, and the clamping groove 62 are not visible, and there is no space for operating the clamping portion 63. As the protruding portion 52 extends inward, it is difficult for an operator to apply an external force to the clamping portion 63, and it is difficult to drive the clamping portion 63 to move inward to disengage the protruding portion 52 from the clamping groove 62, thus the inward movement of the clamping portion 63 is restricted. In this embodiment, the side wall where the first sleeve 50 is located is located outside the clamping portion 63, thus the clamping portion 63 is restricted from moving in a direction away from the side wall of the first sleeve 50, which makes it more difficult for the protruding portion 52 to disengage from the clamping groove 62, so that the connection between the first sleeve 50 and the second sleeve 60 is more stable, and it is difficult for a worker to detach the cable protection device.

In an embodiment of the present disclosure, the first sleeve 50 is provided with an abutting plate 53 for abutting against the end face of the second sleeve 60, so as to limit the stroke of the second sleeve 60 moving in the butting direction 100 relative to the first sleeve 50 and play a positioning role.

As shown in FIGS. 1 to 3B, the first sleeve 50 is connected with at least one first cable duct 91, and the second sleeve 60 is connected with at least one second cable duct 92. The first cable duct 91, the first accommodating cavity 51, the second accommodating cavity 61, and the second cable duct 92 are in communication with each other. For example, the cable may enter the first accommodating cavity 51 and the second accommodating cavity 61 through the first cable duct 91, and then is divided into a plurality of cables. The plurality of cables may pass through the plurality of second cable ducts 92, respectively.

Locking Barrel

Figure 9:
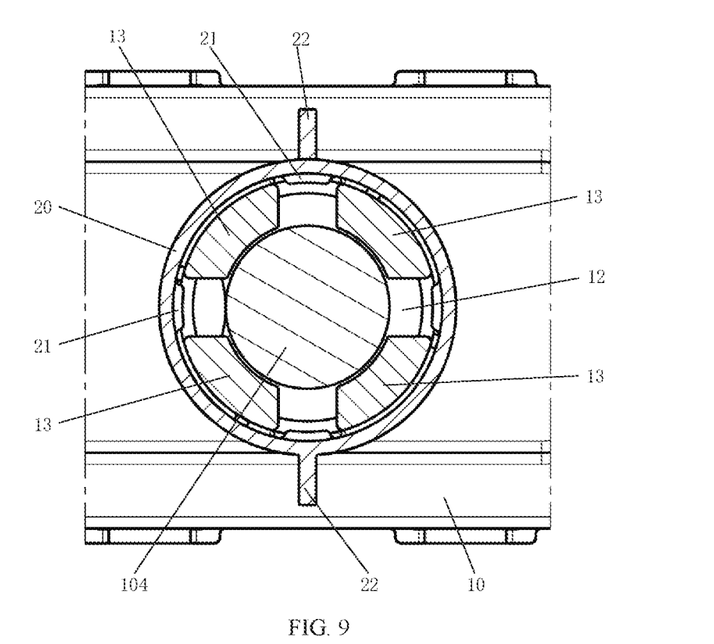
FIG. 9 is a right side view of the cable protection device shown in FIG. 6 in a first state.
Figure 10:
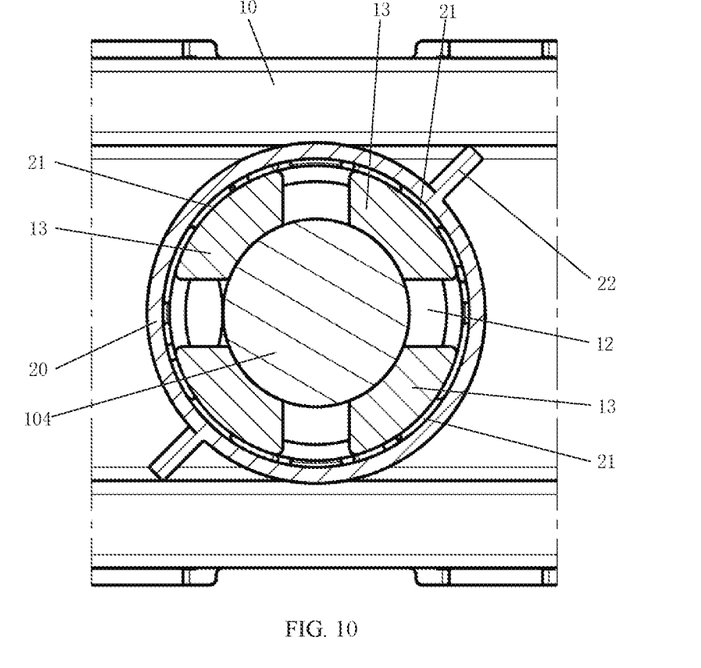
FIG. 10 is a right side view of the cable protection device shown in FIG. 6 in a second state.

As shown in FIGS. 6, 7, 3A and 11, the cable protection device includes a sleeve 10 and a locking barrel 20. The sleeve 10 is provided with a cable duct 11. The locking barrel 20 is configured to sleeve outside the cable duct 11. An end portion of the cable duct 11 is provided with a pressing arm 13 and an opening slot 12 adjacent to the pressing arm 13. The inner wall of the locking barrel 20 is provided with a pressing bump 21 which can be inserted into the opening slot 12. As shown in FIGS. 9 and 10, the pressing bump 21 is configured to rotate with the locking barrel 20 to the outer side of the pressing arm 13 to press the pressing arm 13 to move inward.

When using the cable protection device, the locking barrel 20 is sleeved on the cable duct 11, and then one end of the cable 104 passes through the cable duct 11 and passes through the locking barrel 20. In the process of inserting the cable 104 into the cable duct 11, as shown in FIG. 9, the pressing bump 21 of the locking barrel 20 is inserted into the opening slot 12, so that the pressing arm 13 is not pressed by the pressing bump 21, and the size of the hole of the end of the cable duct 11 is large, which reduces the resistance between the cable duct 11 and the moving cable 104, and facilitates the cable 104 to pass through the cable duct 11. After the cable 104 has been adjusted into place, the locking barrel 20 is rotated to drive the pressing bump 21 to rotate to the outer side of the pressing arm 13, where the pressing bump 21 presses the pressing arm 13 inward, and makes the pressing arm 13 move inward to reduce the size of the hole at the end of the cable duct 11. Therefore, the pressing arm 13 presses against the outer wall of the cable 104 to prevent the cable duct 11 from displacing, thereby keeping the position of the cable 104 stable, reducing the risk of the cable 104 disengaging from the fixed connection position, and reducing the failure of the cable 104.

Figure 1:
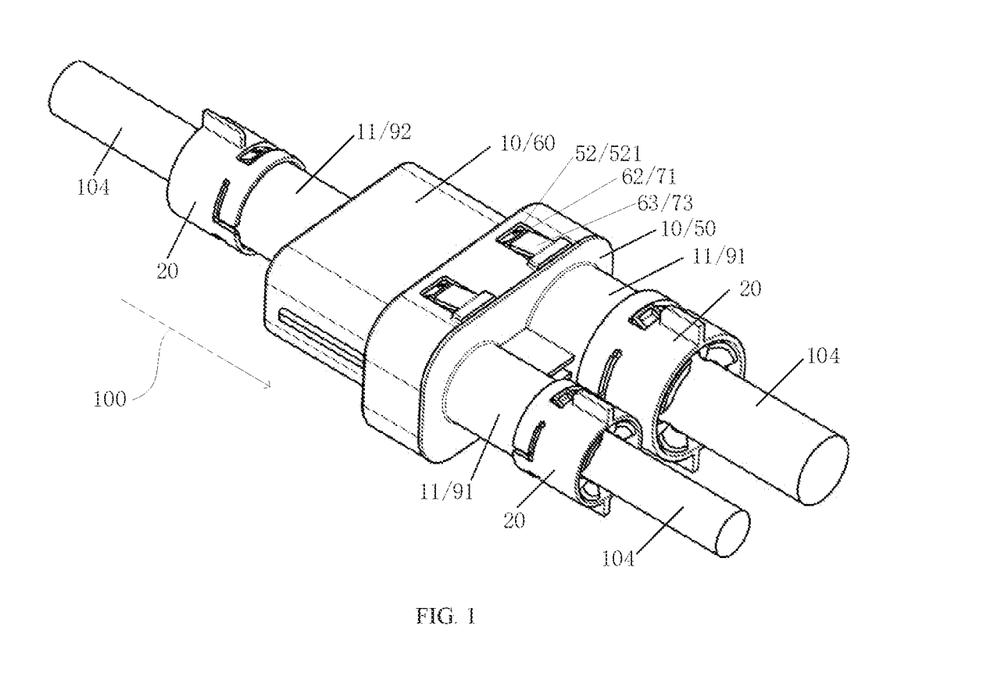
FIG. 1 is an overall schematic diagram of a cable protection device provided by the present disclosure.

The sleeve 10 is provided with an accommodating cavity 101 for accommodating and carrying a wire. The opening slot 12 is capable of receiving the pressing bump 21, which is disposed to pass through the opening slot 12 and is capable of moving in the opening slot 12 along the longitudinal direction of the cable duct 11, and the pressing bump 21 cooperates with the opening slot 12 to play a positioning role. In the process of sleeving the locking barrel 20 on the cable duct 11, the pressing bump 21 and the opening slot 12 guide the locking barrel 20 to move along the bus of the cable duct 11. As shown in FIGS. 2A and 1, the sleeve 10 may be provided with a plurality of cable ducts 11, and multi-stranded cables 104 pass through the cable ducts 11 respectively. The locking barrel 20 connected to each cable duct 11 prevents the displacement of each stranded of cable 104. As shown in FIG. 1, the cable protection device includes a plurality of sleeves 10 that are butted in sequence and through which the cable 104 passes. The locking barrels 20 at two ends respectively lock the positions of the two ends of the cable 104, so as to reduce the displacement of the cable 104 and keep the cable 104 stably held in the cable protection device. The connection position of the multi-strand cables 104 may be disposed in the cable protection device, so as to prevent the multi-strand cables 104 from being disconnected and ensure the reliability of the connection of the cable 104.

The pressing bump 21 presses the pressing arm 13 inward to make the pressing arm 13 deform inward and press the cable 104, so that a friction force is generated between the pressing bump 21 and the pressing arm 13 to prevent relative movement of the locking barrels 20 and the cable duct 11. In an embodiment of the present disclosure, the cable protection device includes at least one locking bump 40 and at least one locking groove 30. At least one locking bump 40 is disposed on the outer wall of the cable duct 11, and at least one locking groove 30 is disposed on the locking barrel 20; and/or at least one locking bump 40 is disposed on the inner wall of the locking barrel 20, and at least one locking groove 30 is disposed on the cable duct 11. The locking bump 40 is configured to be embedded in the locking groove 30 to define the position of the locking barrel 20 on the cable duct 11, which is beneficial to keep the position of the locking barrel 20 on the cable duct 11 stable, and keep the locking barrel 20 and the cable duct 11 in the state shown in FIG. 10, where the pressing arm 13 is pressed inwardly against the cable 104 by the pressing bump 21.

As shown in FIGS. 7, 8, 3A, 11 and 2A, the locking bump 40 is disposed on the outer wall of the cable duct 11, and the locking groove 30 is disposed on the locking barrel 20. Compared to being disposed on the inner wall of the cable tube 11, the locking bump 40 being disposed on the outer wall of the cable tube 11 is easier to mold, and reduces the manufacturing difficulty of the cable protection device. The position of the locking barrel 20 on the cable duct 11 is defined by matching the locking groove 30 with the locking bump 40. The locking groove 30 and the locking bump 40 are disposed in a manner not limited to those shown in FIGS. 7, 8, 3A, 11 and 2A. As another embodiment, the locking bump 40 is disposed on the inner wall of the locking barrel 20, and the locking groove 30 is disposed on the cable duct 11. As an alternative embodiment, at least one locking bump 40 is disposed on the inner wall of the locking barrel 20, and the mating locking groove 30 is disposed on the cable duct 11; and at least one locking bump 40 is disposed on the outer wall of the cable duct 11, and the mating locking groove 30 is disposed on the locking barrel 20.

Figure 7:
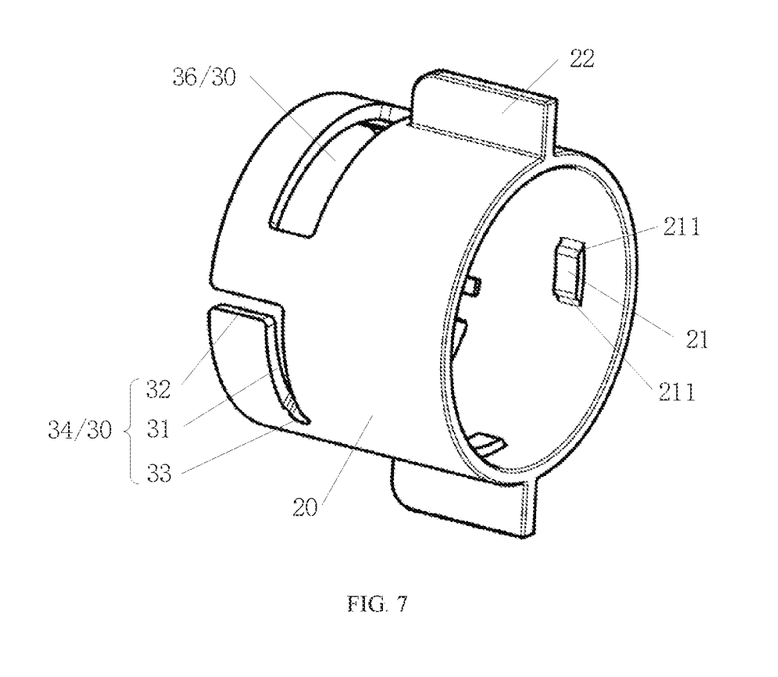
FIG. 7 is a structural schematic diagram of a locking barrel of the cable protection device shown in FIG. 6, viewed from a first perspective.

The locking bump 40 is configured to be embedded in the locking groove 30, and the locking groove 30 may be a through groove or a concave groove. When the locking groove 30 is disposed on the locking barrel 20, optionally, as shown in FIG. 7, the locking groove 30 is a through groove for convenience of manufacturing.

Figure 8:
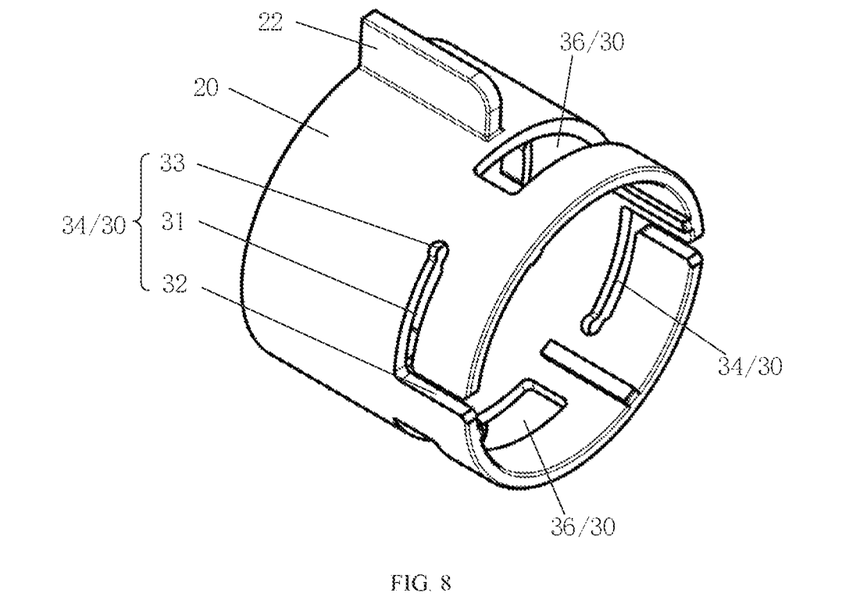
FIG. 8 is a structural schematic diagram of a locking barrel of the cable protection device shown in FIG. 6, viewed from a second perspective.

In an embodiment, the locking groove 30 includes a circumferential groove portion 31 extending along a planar circumferential line around the axis of the cable duct 11, and the locking bump 40 is configured to be rotatably embedded in the circumferential groove portion 31. As shown in FIGS. 7 and 8, the locking bump 40 can rotate in the circumferential groove portion 31 along a plane circumferential line around the axis of the cable duct 11, so that the locking barrel 20 rotates without axial displacement. By rotating the locking barrel 20 by a small angle, it is possible to move the pressing bump 21 to the outer wall of the pressing arm 13 to press and lock the cable 104.

Further, the locking groove 30 includes an axial groove portion 32 which is in communication with the circumferential groove portion 31. The axial groove portion 32 is configured to guide the locking bump 40 to enter the circumferential groove portion 31. When the locking barrel 20 is sleeved on the cable duct 11, the locking bump 40 first enters and moves along the axial groove portion 32, and then moves into the circumferential groove portion 31, so as to facilitate smooth installation of the locking barrel 20.

Further, an end of the circumferential groove portion 31 has a locking portion 33 configured to press the locking bump 40 inward by a side wall of the locking portion 33. As shown in FIG. 8, the size of the locking portion 33 is smaller compared to the groove width of the starting section of the circumferential groove portion 31. After the locking bump 40 enters the locking portion 33, the side wall of the locking portion 33 presses the locking bump 40 to generate resistance to the locking bump 40 to prevent the locking bump 40 from retreating, thereby holding the locking bump 40 in the locking portion 33. Exemplarily, the locking bump 40 is of cylindrical shape, and the shape of the locking portion 33 is matched with the locking bump 40. The locking portion 33 may be a circular hole. The side wall of the locking portion 33 surrounds the locking bump 40, and the locking portion 33 is provided with an opening for the locking bump 40 to enter the locking portion 33. The opening in a natural state is smaller than the locking bump 40, so as to prevent the locking bump 40 from exiting the locking portion 33 after the locking bump 40 enters the locking portion 33. As shown in FIG. 8, the axial groove portion 32, the circumferential groove portion 31, and the locking portion 33 are connected in sequence to constitute a positioning groove 34. The locking bump 40 constitutes a positioning column 41 which can move in the positioning groove 34 to ensure the smooth movement of the locking barrel 20, and when the positioning column 41 moves to the locking portion 33, locking is achieved.

In another embodiment, the locking groove 30 includes a spiral groove portion extending along a spiral line around the axis of the cable duct 11. The locking bump 40 moves along the spiral groove portion, and the trajectory of movement of the locking bump 40 is a spiral line around the axis of the cable duct 11. Therefore, rotation of the locking barrel 20 can drive the pressing bump 21 to rotate to the outer side of the pressing arm 13, and the locking bump 40 is threadedly engaged with the spiral groove portion. The locking barrel 20 is rotated to generate a frictional force between the locking bump 40 and the spiral groove portion, and the position of the locking barrel on the cable duct 11 can be stabilized by the frictional force.

In still another embodiment, as shown in FIGS. 7, 8, 3A, 11 and 2A, the locking groove 30 is a circumferential clamping groove 36, and the locking bump 40 is a first locking clamping block 42. The first locking clamping block 42 is configured to be clamped with the circumferential clamping groove 36 to prevent the locking barrel 20 from moving relative to the cable duct 11 in the axial direction of the cable duct 11, and the first locking clamping block 42 can rotate in the circumferential clamping groove 36. The axial position of the locking barrel 20 on the cable duct 11 is defined by the circumferential clamping groove 36 and the first locking clamping block 42. The first locking clamping block 42 can rotate in the circumferential clamping groove 36, thereby allowing the locking barrel 20 to rotate on the cable duct 11.

Figure 11:
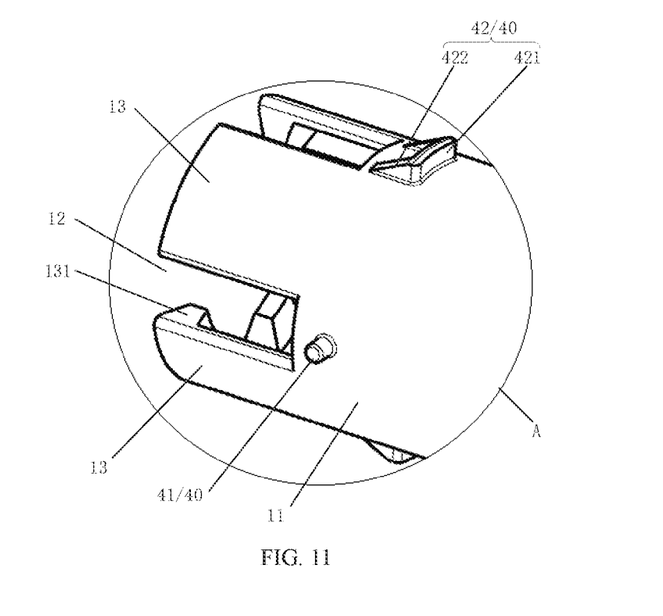
FIG. 11 is an enlarged fragmentary view of position A in FIG. 3A.

As shown in FIGS. 3A, 11 and 2A, the first locking clamping block 42 includes a clamping block upright plate 421 configured to abut against an inner wall of the circumferential clamping groove 36 such that the first locking clamping block 42 is clamped to the circumferential clamping groove 36. In an embodiment, the first locking clamping block 42 includes a clamping block rib plate 422 connected to the clamping block upright plate 421. The clamping block rib plate 422 increases the strength of the first locking clamping block 42, and makes the first locking clamping block 42 not easily to be deformed. Specifically, the clamping block rib plate 422 may be provided extending in the longitudinal direction of the cable duct 11.

In another embodiment, the locking groove 30 is an axial clamping groove, and the locking bump 40 is a second locking clamping block. The axial clamping groove and the second locking clamping block are configured as the second locking clamping block being clamped in the axial clamping groove, so as to prevent the locking barrel 20 from rotating about the axis of the cable duct 11 relative to the cable duct 11. The locking barrel 20 is sleeved outside the cable duct 11, then the locking barrel 20 is rotated until the second locking clamping block enters the axial clamping groove which prevents the locking barrel 20 from rotating, thereby limiting the position of the locking barrel 20. Exemplarily, the locking barrel 20 is provided with an axial clamping groove and a circumferential groove portion 31, and the position of the locking barrel 20 is locked by the cooperation of the axial clamping groove and the axial groove portion 32, which has the advantages of accurate positioning and reliable locking.

Further, the cable protection device includes a plurality of locking bumps 40 and a plurality of locking grooves 30. The plurality of locking bumps 40 are disposed on the outer wall of the cable duct 11, and the plurality of locking grooves 30 are disposed on the locking barrel 20. As shown in FIGS. 7, 8, 3A, 11 and 2A, at least one of the locking grooves 30 includes a circumferential groove portion 31 extending along a planar circumferential line around the axis of the cable duct 11. At least one of the locking bumps 40 is rotatable in the circumferential groove portion 31. At least one of the locking grooves 30 is a circumferential clamping groove 36, and at least one of the locking bumps 40 is a first locking clamping block 42. The first locking clamping block 42 can be clamped with the circumferential clamping groove 36, so as to prevent the locking barrel 20 from moving relative to the cable duct 11 in the axial direction of the cable duct 11. The first locking clamping block 42 can rotate in the circumferential clamping groove 36. The position of the locking barrel 20 is locked by the cooperation of the circumferential clamping groove 36 and the circumferential groove portion 31, which has the advantages of accurate positioning and reliable locking.

As shown in FIG. 7, the pressing bump 21 has a bump inclined surface 211 for being in lap joint with the pressing arm 13. When the locking barrel 20 is rotated, the bump inclined surface 211 guides the pressing bump 21 to rotate to the outer side of the pressing arm 13. At the beginning, the pressing bump 21 is disposed to pass through the opening slot 12, and the bump inclined surface 211 is in contact with the side wall of the pressing arm 13. When the locking barrel 20 is rotated, the bump inclined surface 211 serves as a guide, which facilitates the movement of the pressing bump 21 toward the outer side of the pressing arm 13. The locking barrel 20 is provided with a handle 22 for easy operation. The number of the handle 22 may be two according to the installation requirement, or may be other numbers according to different specifications, such as 3, 5, 6 and so on. There are two upper handles 22 and two lower handles 22 in the overall layout according to the installation requirements, this layout is conducive to uniform stress during installation and meets the strength requirements for anti-removal, and other different layout schemes can be used according to different installation requirements.

As shown in FIGS. 6, 3A, 11 and 2A, the inner wall of the pressing arm 13 is provided with an arm bump 131, and the pressing arm 13 abuts against the cable 104 through the arm bump 131, which is advantageous in concentrating the pressing force on the cable 104 on the arm bump 131 and generating greater resistance, so as to better prevent the displacement of the cable 104 and improve the stability of the position of the cable 104.

In an embodiment of the present disclosure, the cable protection device includes a shielding structure disposed in the first accommodating cavity and the second accommodating cavity. The shielding structure is configured to allow the cable to pass through the shielding structure. The structure of the shielding structure is not limited to one type. For example, the shielding structure may be a shielding shell that wraps the connection part of the cable and allows a plurality of cables to pass through respectively. Alternatively, the shielding shell may be a split structure, so that the shielding shell is conveniently sheathed to the connection part of the cable.

Further, a shielding gap is arranged at the splicing position of the shielding structure, and an EMI gasket is arranged in the shielding gap. The shielding gap is configured to compress the thickness of the EMI gasket to 10%-95% to improve the shielding effect. The relationship between the EMI gasket thickness compression ratio and the shielding performance is shown in the following table. Specifically, the shielding structure includes a first shell and a second shell, the first shell and the second shell are spliced to form a shielding shell through which a cable passes. A shielding gap is formed at the splicing position of the first shell and the second shell, and an EMI gasket is disposed at the splicing position of the first shell and the second shell. The EMI gasket is compressed by being squeezed, and the thickness of the EMI gasket is reduced to 10% to 95% of its initial thickness.

| EMI gasket thickness compression ratio | 5% | 10% | 15% | 20% | 25% | 30% | 35% |
|---|---|---|---|---|---|---|---|
| Shielding performance (dB) | 39.5 | 60.1 | 62.6 | 63.3 | 65.9 | 67.6 | 70.2 |
| EMI gasket thickness compression ratio | 40% | 45% | 50% | 55% | 60% | 65% | 70% |
| Shielding performance (dB) | 72.5 | 75.6 | 78.6 | 80.8 | 82.5 | 85.1 | 87.6 |
| EMI gasket thickness compression ratio | 75% | 80% | 85% | 90% | 95% | 96% | |
| Shielding performance (dB) | 89.1 | 91.9 | 93.5 | 95.2 | 95.5 | 50.6 | |

Next, the structure, shape and size of the sleeve 10 will be described in detail.

The sleeve 10 includes an accommodating cylinder 103 and a butting cylinder 102. The accommodating cavity 101 is disposed in the accommodating cylinder 103 and the butting cylinder 102. The accommodating cylinder 103 and the butting cylinder 102 carry wires and protect the wires to meet the requirements of flame retardancy and resistance to damage.

The cable protection device may be applied to protect a cable, such as a wire or a high-voltage harness, and may also be applied to protect other harness-like products.

As shown in FIGS. 2A and 2B, the first sleeve 50 includes a first cable duct 91 and a butting cylinder 102. As shown in FIGS. 3A and 3B, the second sleeve 60 includes a second cable duct 92, an accommodating cylinder 103 and a butting cylinder 102.

The first cable duct 91 and the second cable duct 92 carry wires and protect the wires to meet the requirements of flame retardancy and resistance to damage. The first cable duct 91 and the second cable duct 92 are of circular shape to match the contour of the wire. Alternatively, the shape of the second cable duct 92 may be ellipse, square, rectangle, rectangle with rounded corners, triangle, trapezoid, parallelogram, rhomboid, polygon, and the like. The diameters of the first cable duct 91 and the second cable duct 92 are designed according to different specifications of the wires, and may be integers (e.g., 10 mm diameter, 20 mm diameter, 30 mm diameter, etc.) or non-integers (e.g., 11.2 mm diameter, 12.2 mm diameter, 13.2 mm diameter, etc.). The draft angle of the first cable duct 91 and the second cable duct 92 may be designed to be 1 degree according to the mold depanning requirement, or may be changed to other angle values, for example, 1.5 degrees, 2 degrees, 0.5 degrees, etc. according to different lengths.

The accommodating cylinder 103, the butting cylinder 102 and the butting cylinder 102 carry the terminals and protect the terminals to meet the requirements of flame retardancy and resistance to damage. The accommodating cylinder 103, the butting cylinder 102 and the butting cylinder 102 are of oval shape, and match the shape of the distributed wire, and alternative contour schemes are circle, square, rectangle, rectangle with rounded corners, triangle, trapezoid, parallelogram, rhomboid, polygon, and the like. The overall dimensions of the accommodating cylinder 103, the butting cylinder 102 and the butting cylinder 102 are designed according to different specifications of the wires, and may be integers (e.g., 10 mm size, 20 mm size, 30 mm size, etc.) or non-integers (e.g., 11.2 mm size, 12.2 mm size, 13.2 mm size, etc.). The draft angle of the accommodating cylinder 103, the butting cylinder 102 and the butting cylinder 102 may be designed to be exemplarily 1 degree according to the mold depanning requirement, or can be changed to other angle values, for example, 1.5 degrees, 2 degrees, 0.5 degrees, etc. according to different lengths. The accommodating cylinder 103, the butting cylinder 102 and the butting cylinder 102 all serve as a carrier of the first clamping structure 70, the second clamping structure 80, the clamping convex column 521 and the positioning clamping column 522, and increase the strength of the clamp when the clamp is stressed to meet the requirements of anti-removal.

As shown in FIGS. 3A and 3B, the second cable duct 92 and the accommodating cylinder 103 are vertically connected to one another to save materials and meet the strength requirement. As shown in FIGS. 2A and 2B, the accommodating cylinder 103 and the butting cylinder 102 are vertically connected to one another to save materials and meet the strength requirement.

According to different assembly requirements, positioning ribs of different shapes are arranged at the outer contours of the accommodating cylinder 103, the butting cylinder 102 and the butting cylinder 102 as positioning points for assembly. The shape of the positioning rib may be rectangular, triangular, cylindrical, or the like. The length and thickness of the positioning rib may be designed according to different assembly requirements, and may be an integer (e.g., size 10 mm, size 20 mm, size 30 mm, etc.) or a non-integer (e.g., size 11.2 mm, size 12.2 mm, size 13.2 mm, etc.).

In order to meet the assembly positioning requirement of the second sleeve 60 and the first sleeve 50, positioning ribs of different shapes are arranged at the inner contours of the accommodating cylinder 103, the butting cylinder 102 and the butting cylinder 102 as positioning points for assembly. The shape of the positioning rib may be rectangular, triangular, cylindrical, or the like. The length and thickness of the positioning rib may be designed according to different assembly requirements, and may be an integer (e.g., size 10 mm, size 20 mm, size 30 mm, etc.) or a non-integer (e.g., size 11.2 mm, size 12.2 mm, size 13.2 mm, etc.).

In order to prevent the sharp part from damaging the peripheral environment and avoid the sharp part from injuring the personnel, the outer contours of the accommodating cylinder 103, the butting cylinder 102 and the butting cylinder 102 are rounded, and an alternative solution is bevel processing, and the size of the rounded and beveled corners can be selected according to different specifications, and may be an integer (e.g., size 1 mm, size 2 mm, size 3 mm, etc.) or a non-integer (e.g., size 1.2 mm, size 2.2 mm, size 3.2 mm, etc.).

The wall thicknesses of the second sleeve 60 and the first sleeve 50 are selected according to different strength requirements, process requirements, etc., and may be an integer (e.g., 1 mm wall thickness, 2 mm wall thickness, 3 mm wall thickness, etc.) or a non-integer (e.g., 1.1 mm wall thickness, 2.1 mm wall thickness, 3.1 mm wall thickness, etc.).

The color of the second sleeve 60 and the first sleeve 50 is orange for warning, and may be other colors such as red, purple, blue, and the like. According to different strength requirements and different temperature resistance levels, as well as different material characteristics requirements, different kinds of materials are selected for the second sleeve 60 and the first sleeve 50, such as one or more selected from the group consisting of polyamide, polyethylene, polypropylene, polystyrene, polymethyl methacrylate, polyvinyl chloride, ethylene propylene diene rubber, nylon, polycarbonate, polytetrafluoroethylene, polyethylene terephthalate, polyoxymethylene, and polyvinyl chloride. The materials are required to meet the requirements of flame retardancy and strength. The surfaces of the second sleeve 60 and the first sleeve 50 are treated with a spark pattern in order to increase the aesthetic effect and to increase the hand feeling. The specifications of the spark pattern are selected according to different specifications, such as Ra0.16, Ra0.25, Ra0.32, and the like.

As shown in FIGS. 2A, 2B, 3A and 3B, the first clamping structure 70 is disposed on the butting cylinder 102, and the clamping convex column 521 is disposed on the butting cylinder 102. The first clamping structure 70 and the clamping convex column 521 are in one-to-one correspondence in position, and the axial position and size of the two can be adjusted according to the fitting length. The clamping position of the first clamping structure 70 and the clamping convex column 521 is where the second sleeve 60 and the first sleeve 50 fit together most tightly, and an alternative solution is that the first clamping structure 70 is disposed on the cable duct 11, and the clamping convex column 521 is disposed on the butting cylinder 102.

The number of the first clamping structure 70 and the clamping convex column 521 may be selected to be four according to the installation requirements, or can be selected to other numbers according to different specifications, such as 3, 5, 6 and so on. Exemplarily, there are two upper and two lower first clamping structures 70, two upper and two lower clamping convex columns 521 in the overall layout according to the installation requirements, this layout is conducive to uniform stress during installation and meets the strength requirements for anti-removal. Other different layout schemes can be used according to different installation requirements, for example, one upper and one lower first clamping structures 70, and one upper and one lower clamping convex columns 521; or one upper and two lower first clamping structures 70, and one upper and two lower clamping convex columns 521; or three upper and three lower first clamping structures 70, and three upper and three lower clamping convex columns 521, and the like.

The shape of the clamping groove 62 is exemplarily of rectangular shape with rounded corners according to installation requirements, and alternative schemes are circle, square, rectangle, rectangle, triangle, trapezoid, parallelogram, rhomboid, polygon, and the like. The angle between the clamping plate 73 and the longitudinal direction of the second sleeve 60 is an inclined angle of the clamping plate 73, the inclined angle is exemplarily 10 degrees depending on the installation requirements, and may be changed to other angles according to different specifications, such as 15 degrees, 20 degrees, 25 degrees, etc.

A certain space is reserved at the front end of the first clamping structure 70 for the arrangement space of the second clamping structure 80 after assembly. The size of the arrangement space is designed according to the size of the second clamping structure 80, and may be an integer (for example, size 1 mm, size 2 mm, size 3 mm, etc.) or a non-integer (for example, size 1.2 mm, size 2.2 mm, size 3.2 mm, etc.).

The overall shape of the clamping convex column 521 and the clamping concave groove 81 is selected as a right triangle according to the installation requirements, and alternative schemes are circle, square, rectangle, rectangle, triangle, trapezoid, parallelogram, rhomboid, polygon, and the like. The top wall of the convex column rib plate 542 of the clamping convex column and the side wall of the clamping concave groove 81 are both inclined plane, and the inclined plane serves mainly as an assembly lead-in during installation. The angle between the inclined plane and the axis of the sleeve 10 may be selected to be 20 degrees depending on the installation requirements, and may be changed to other angles according to different specifications, such as 10 degrees, 15 degrees, 25 degrees, etc. The numbers of the second clamping structure 80 and the positioning clamping column 522 may be selected to be two according to the installation requirements, or can be selected to be other numbers according to different specifications, such as 3, 4, 5 and so on.

There are one left and one right second clamping structures 80, one left and one right positioning clamping columns 522 in the overall layout according to the installation requirements, this layout is conducive to uniform stress during installation and meets the strength requirements for anti-removal. Other different layout schemes can be used according to different installation requirements, for example, one upper and one lower second clamping structures 80, and one upper and one lower positioning clamping columns 522; or one left and two right second clamping structures 80, and one left and two right positioning clamping columns 522; or two left and two right second clamping structures 80, and two left and two right positioning clamping columns 522, and the like. The overall shape of the second clamping structure 521 is selected as a trapezoid according to the installation requirements, and alternative schemes are circle, square, rectangle, triangle, trapezoid, parallelogram, rhomboid, polygon, and the like. The overall shape of the positioning clamping column 522 is selected as an inverted trapezoid according to the installation requirements, and alternative schemes are circle, square, rectangle, triangle, trapezoid, parallelogram, rhomboid, polygon, and the like. The inclined angle of the second clamping structure 80 and the positioning clamping column 522 may be selected as 20 degrees according to the installation requirements, and may be changed to other angles according to different specifications, such as 10 degrees, 15 degrees, 25 degrees, etc.

The cable protection device is realized according to the following principle: for the first clamping structure 70 and the clamping convex column 521, under the guidance of the top wall of the convex column rib plate 542 of the clamping convex column 521, the clamping plate 73 is guided to gradually move along a trajectory with a fixed slope during assembly. Upon reaching the lap joint surface required for assembly, the clamping plate 73 is elastically deformed to a deformation value required for fixing. Thereafter, the clamping plate 73 crosses over the top wall of the convex column rib plate 542 of the clamping convex column 521, and then is resiliently deformed upon crossing the lap joint surface, at this time, the assembly lap joint surface of the clamping plate 73 overlaps with that of the clamping convex column 521. After being completely locked, the first clamping structure 70 stops moving to meet the assembly requirement. Since the lap joint surface of the first clamping structure 70 is shielded by the lap joint surface of the clamping convex column 521 after assembly, the lap joint surface of the first clamping structure 70 cannot be contacted by a tool after the assembly is completed, so that the first clamping structure 70 cannot be elastically deformed again through the operation of the tool, thereby preventing the disassembly operation and meeting the disassembly prevention requirement.

For the second clamping structure 80 and the positioning clamping column 522, under the guidance of the inclined guide of the positioning clamping column 522, the second clamping structure 80 and the abutting cylinder 102 are gradually guided during assembly to be elastically deformed to a deformation value required for fixing. The second clamping structure 80 is resiliently deformed after crossing the assembly section of the positioning clamping column 522 and crossing the lap joint surface, and the assembly lap joint surface of the second clamping structure 80 and that of the positioning clamping column 522 overlap with each other. After being completely locked, the second clamping structure 80 stops moving to meet the assembly requirement.

Since the lap joint surface of the positioning clamping column 522 is completely wrapped by the butting cylinder 102 after assembly, and the butting cylinder 102 is insert into the cavity of the butting cylinder 102, the lap joint surface of the positioning clamping column 522 is hidden and invisible, the tool cannot contact the second clamping structure 80, so that the second clamping structure 80 cannot be elastically deformed again through the operation of the tool, thereby preventing the disassembly action and meeting the disassembly prevention requirement.

The cable protection device adopts a precision injection molding process to meet the size requirement of the cable protection device by controlling equipment accuracy and mold error. The injection molding process is controlled by a mold clamping force, injection position measurement accuracy, an injection speed, an injection pressure and mold temperature, so as to meet the elastic deformation requirements of the buckle and the strength requirements of the buckle. The specific parameters are exemplarily as follows: when the mold clamping force is zero, the injection accuracy is less than 0.03 mm; when the mold clamping force is maximum, the injection accuracy is less than 0.005 mm; the injection speed is greater than or equal to 300 mm/s; the injection pressure shall be greater than 25 MPa; the mould temperature variation shall be controlled within ±1° C.; the cable protection device adopts automatic assembly process, the assembly procedure is controlled by automatic assembly tooling, so as to meet the requirements of installation force, installation depth, installation position, buckle deformation travel, no wrong installation, no missing installation and no reverse installation.

Main structure of automatic assembly tooling includes an industrial control computer, an air cylinder, a lead screw, a slide rail, a positioning structure, a guiding mechanism, an error-proof mechanism, etc.

The foregoing is merely an illustrative embodiment of the present disclosure and is not intended to limit the scope of the present disclosure. Any equivalent changes and modifications made by those skilled in the art without departing from the concepts and principles of the present disclosure shall fall within the scope of the present disclosure.

What is claimed is:

1. A cable protection device, comprising:
a first sleeve provided with a first accommodating cavity for accommodating a cable, and configured to allow the cable to pass through the first accommodating cavity;
a second sleeve provided with a second accommodating cavity for accommodating a cable, and configured to allow the cable to pass through the second accommodating cavity, wherein the second sleeve is capable of being moved in a butting direction to butt with the first sleeve;
wherein a side wall of the first sleeve is provided with a protruding portion, and a side wall of the second sleeve is provided with a clamping groove and a clamping portion which are sequentially distributed in the butting direction;
in the case of the second sleeve being butted with the first sleeve, the first accommodating cavity is at least partially in communication with the second accommodating cavity, the protruding portion is clamped with the clamping groove, the clamping portion is configured to prevent the protruding portion from disengaging from the clamping groove, and the clamping portion is restricted from moving in a direction away from the side wall of the first sleeve;
the second sleeve is configured to sleeve outside the first sleeve in the butting direction, and the protruding portion is disposed on an outer wall of the first sleeve;
the side wall of the second sleeve is provided with a first clamping structure comprising the clamping groove and the clamping portion;
the clamping groove is a clamping through groove; and
the clamping portion is a clamping plate, and the clamping plate is inclined outwardly in the butting direction.

2. The cable protection device according to claim 1, wherein the first clamping structure comprises a guiding groove, the clamping plate and the guiding groove are connected to one another in sequence in the butting direction, and the clamping plate is connected to a groove bottom surface of the guiding groove.

3. The cable protection device according to claim 1, wherein the side wall of the second sleeve is provided with a plurality of the first clamping structures.

4. The cable protection device according to claim 3, wherein the clamping groove of at least one of the first clamping structures is disposed opposite to the clamping groove of another of the first clamping structures.

5. The cable protection device according to claim 1, wherein the protruding portion comprises a convex column upright plate capable of moving into the clamping groove along the clamping plate and abutting against an end face of the clamping plate that is close to the clamping groove.

6. The cable protection device according to claim 5, wherein the protruding portion comprises a convex column rib plate which is connected between an outer wall of the first sleeve and the convex column upright plate.

7. The cable protection device according to claim 1, wherein the first sleeve is provided with an abutting plate for abutting against an end face of the second sleeve.

8. The cable protection device according to claim 1, wherein the first sleeve is connected with at least one first cable duct, and the second sleeve is connected with at least one second cable duct; and the first cable duct, the first accommodating cavity, the second accommodating cavity, and the second cable duct are in communication with each other.

9. The cable protection device according to claim 1, wherein the cable protection device comprises a shielding structure disposed in the first accommodating cavity and the second accommodating cavity; and
the shielding structure is configured to allow the cable to pass through the shielding structure.

10. The cable protection device according to claim 9, wherein a shielding gap is arranged at a splicing position of the shielding structure, an EMI gasket is arranged in the shielding gap, and the shielding gap is configured to compress the thickness of the EMI gasket to 10%-95%.

11. A cable protection device, comprising:
a first sleeve provided with a first accommodating cavity for accommodating a cable, and configured to allow the cable to pass through the first accommodating cavity;
a second sleeve provided with a second accommodating cavity for accommodating a cable, and configured to allow the cable to pass through the second accommodating cavity, wherein the second sleeve is capable of being moved in a butting direction to butt with the first sleeve;
wherein a side wall of the first sleeve is provided with a protruding portion, and a side wall of the second sleeve is provided with a clamping groove and a clamping portion which are sequentially distributed in the butting direction;
in the case of the second sleeve being butted with the first sleeve, the first accommodating cavity is at least partially in communication with the second accommodating cavity, the protruding portion is clamped with the clamping groove, the clamping portion is configured to prevent the protruding portion from disengaging from the clamping groove, and the clamping portion is restricted from moving in a direction away from the side wall of the first sleeve;
the second sleeve is configured to sleeve outside the first sleeve in the butting direction, and the protruding portion is disposed on an outer wall of the first sleeve; and
the side wall of the second sleeve is provided with a second clamping structure comprising the clamping groove and the clamping portion, and the clamping groove is a clamping concave groove.

12. The cable protection device according to claim 11, wherein the clamping portion comprises a first clamping bump, and the second clamping structure comprises a second clamping bump; and
the first clamping bump and the second clamping bump are distributed sequentially at intervals in the butting direction, and the clamping groove is disposed between the first clamping bump and the second clamping bump.

13. The cable protection device according to claim 11, wherein the side wall of the second sleeve is provided with a plurality of the second clamping structures that are oppositely arranged.

14. The cable protection device according to claim 11, wherein the first sleeve is provided with an abutting plate for abutting against an end face of the second sleeve.

* * * * *